(12) United States Patent
Sato et al.

(10) Patent No.: US 12,134,819 B2
(45) Date of Patent: Nov. 5, 2024

(54) CESIUM TUNGSTEN OXIDE FILM AND METHOD FOR MANUFACTURING SAME

(71) Applicant: SUMITOMO METAL MINING CO., LTD., Tokyo (JP)

(72) Inventors: Keiichi Sato, Tokyo (JP); Isao Ando, Tokyo (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

(21) Appl. No.: 16/649,213

(22) PCT Filed: Jul. 20, 2018

(86) PCT No.: PCT/JP2018/027262
§ 371 (c)(1),
(2) Date: Mar. 20, 2020

(87) PCT Pub. No.: WO2019/058737
PCT Pub. Date: Mar. 28, 2019

(65) Prior Publication Data
US 2020/0299825 A1    Sep. 24, 2020

(30) Foreign Application Priority Data

Sep. 22, 2017  (JP) ............................... 2017-182575
Feb. 2, 2018   (JP) ............................... 2018-017381

(51) Int. Cl.
*C30B 29/32*  (2006.01)
*C23C 14/08*  (2006.01)
(Continued)

(52) U.S. Cl.
CPC .............. *C23C 14/34* (2013.01); *C23C 14/08* (2013.01); *C23C 14/083* (2013.01);
(Continued)

(58) Field of Classification Search
None
See application file for complete search history.

(56) References Cited

U.S. PATENT DOCUMENTS 3,505,108 A * 4/1970 Mochel .................... C03C 17/25
                                                    428/433
8,324,300 B2 * 12/2012 Adochio ................... B82Y 30/00
                                                    977/773
(Continued)

FOREIGN PATENT DOCUMENTS

EP    3 431 564 A1    1/2019
JP    H08-12378 A     1/1996
(Continued)

OTHER PUBLICATIONS

JP-2015199668-A Translation (Year: 2015).*
(Continued)

*Primary Examiner* — Humera N. Sheikh
*Assistant Examiner* — Elizabeth D Ivey
(74) *Attorney, Agent, or Firm* — Oliff PLC

(57) ABSTRACT

A cesium tungsten oxide film has high heat ray shielding performance and a radio wave transmissivity, and a method for manufacturing a cesium tungsten oxide film capable of manufacturing such film by a dry method. A cesium tungsten oxide film including cesium, tungsten and oxygen as main components, wherein, an atomic ratio of the cesium and the tungsten is Cs/W, which is 0.1 or more and 0.5 or less, and the cesium tungsten oxide film is having a hexagonal crystal structure. A method for manufacturing a cesium tungsten oxide film including cesium, tungsten and oxygen as main components, including: a film deposition process using a cesium tungsten oxide target; and a heat treatment process for heat-treating the film at a temperature of 400° C. or more and less than 1000° C., wherein either the film deposition
(Continued)

process or the heat treatment process is performed in an atmosphere containing oxygen.

10 Claims, 1 Drawing Sheet

(51) Int. Cl.
    *C23C 14/34*     (2006.01)
    *C23C 14/58*     (2006.01)
    *C30B 29/22*     (2006.01)
    *C03C 17/245*     (2006.01)

(52) U.S. Cl.
    CPC .......... *C23C 14/5806* (2013.01); *C30B 29/22* (2013.01); *C30B 29/32* (2013.01); *C03C 17/245* (2013.01)

(56) References Cited

U.S. PATENT DOCUMENTS

| 2006/0178254 | A1* | 8/2006 | Takeda | C09D 5/32 501/1 |
| 2007/0187653 | A1* | 8/2007 | Takeda | C01G 41/006 252/301.36 |
| 2015/0153478 | A1* | 6/2015 | Takeda | H01B 1/20 427/126.3 |
| 2018/0170021 | A1 | 6/2018 | Machida et al. | |

FOREIGN PATENT DOCUMENTS

| JP | H09-107815 | A | | 4/1997 |
| JP | 2006-096656 | A | | 4/2006 |
| JP | 4096205 | B2 | | 6/2008 |
| JP | 2010-180449 | A | | 8/2010 |
| JP | 2010-215451 | A | | 9/2010 |
| JP | 2015199668 | A | * | 11/2015 |
| WO | 2017/159790 | A1 | | 9/2017 |

OTHER PUBLICATIONS

Effects of annealing on near-infrared shielding properties of Cs-doped tungsten oxide thin films deposited by electron beam evaporation; Chak Seng Long, Horng-Hwa Lu *, Ding-Fwu Lii, Jaw-Lay Huang; Surface & Coatings Technology 284 (2015) 75-79 (Year: 2015).*
Aug. 28, 2018 International Search Report issued in International Patent Application No. PCT/JP2018/027262.
1 Jul. 5, 2021 Extended European Search Report issued in European Patent Application No. 18859728.0.

* cited by examiner

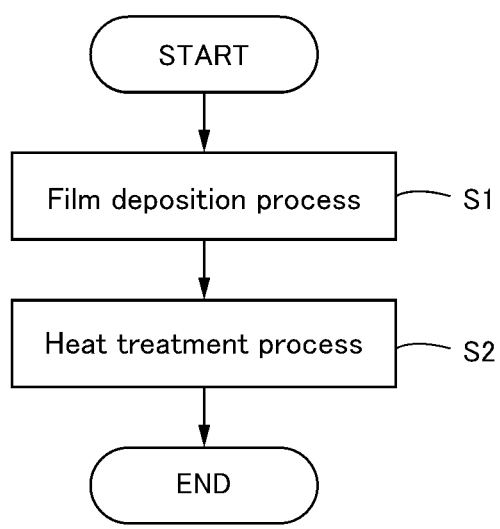

CESIUM TUNGSTEN OXIDE FILM AND METHOD FOR MANUFACTURING SAME

BACKGROUND OF THE INVENTION

Field of the Invention

The present invention relates to a cesium tungsten oxide film suitable as a light-shielding member, and to a method for manufacturing same. This application is based upon and claims the benefit of priority from Japanese Patent Application No. 2017-182575 filed on Sep. 22, 2017 in Japan, and Japanese Patent Application No. 2018-017381 filed on Feb. 2, 2018 in Japan, which are incorporated by reference herein.

Description of Related Art

As a light-shielding member used for window materials or the like, various materials are proposed. For example, in Patent Literature 1, a dry film half mirror type light-shielding member, in which a vapor deposition of a metal such as aluminum is performed, is described. In addition, there is a light-shielding member in which a film is deposited by sputtering silver or the like. However, when this type of light-shielding member is used, it will have a half mirror appearance, so a reflection is too bright to be used at outside, and it will be an issue for view. Further, a metal film of aluminum, silver, or the like is having high conductivity, so it also reflects radio waves and it will be an issue that portable phones or smart phones will be difficult to be connected.

In contrast, in Patent Literature 2, it is proposed to use a composite tungsten oxide thin film as a light-shielding member. The composite tungsten oxide thin film efficiently shields solar rays, especially a light of near-infrared region, and also, maintains high transparency in a visible light region, and it is known as a material expressing excellent optical properties. In Patent Literature 2, as a method for forming such composite tungsten oxide thin film, it is proposed to disperse composite tungsten oxide fine particles in an appropriate solvent to prepare a dispersion liquid, and to coat it onto a surface of a base material, after adding a medium resin into the obtained dispersion liquid. A fine particle dispersing film does not occur an issue of shielding radio waves, as radio waves transmit through spaces between fine particles.

In Patent Literature 3, a composite tungsten oxide film manufactured by heat-treating a substrate after applying a solution containing raw material compounds of composite tungsten oxide on the substrate, is disclosed. This film is having a low surface resistance (sheet resistance) of $1.0*10^{10}$ ohm per square or less, so it is a radio wave-shielding film as it does not transmit radio waves. In addition, in an applied and fired film in which a solution is applied and heat-treated, there is significant volume contraction by drying and firing, so there is an issue that an exfoliation or a crack of the film tends to occur.

As other means for obtaining such composite tungsten oxide thin film, there is a dry method such as a vapor deposition method or a sputtering method. A thin film of the dry method is having an advantage that it does not occur significant volume contraction as in the applying and firing method. In addition, there is an advantage that it is not necessary to use a medium resin or a dispersing agent which is directly irrelevant to a light-shielding performance. In other words, it does not use the medium resin or the like, so it can be used for high temperature manufacturing process. For example, it can be used for a manufacturing process for a reinforced glass, which is heat-treated at high temperature. If manufacturing facilities such as a large-size sputtering device capable of treating a large-size window material is available, a high quality film with uniform film thickness can be obtained, and also, from a point of view that it is also having a high productivity, it can be said that it is preferable to use the dry method. In addition, such large-size sputtering device or the like is commercially available.

In Patent Literature 4, a composite tungsten oxide film prepared by a sputtering method is proposed. The composite tungsten oxide film, which is composed of tungsten and at least one type of elements selected from a group consists of IVa group, Ma group, VIIb group, VIb group and Vb group in the periodic table, is formed on a glass substrate. However, the oxide film with this composition is not having a sufficient heat ray shielding performance as an infrared transmissivity is 40% or more, and there was an issue that it does not exert its function unless it is configured as a multi-layer film with other transparent dielectric film.

In addition, in Patent Literature 5, a method for manufacturing a target material of a composite tungsten oxide containing alkaline metals such as cesium and/or alkaline earth metals by a hot-pressing method is disclosed. However, there is no concrete description of a film prepared using this target, and there was an issue that, even when a film is deposited by simply sputtering this target, it is having a low heat ray shielding performance as it transmits 70% or more of infrared rays.

In detail, about Cs—W—O based tungsten oxide material generally used as a heat ray shielding material and said to have highest infrared absorption feature, among compositions described in Patent Literature 5, a sintered body target was prepared according to Patent Literature 5, and a film was deposited by sputtering it onto a glass substrate. As a result, it was understood that there is an issue that it is having high infrared transmissivity and low heat ray shielding performance. In addition, as a result of X-ray diffraction, this film was non-crystalline.

Patent Literature 1: JP H9-107815 A
Patent Literature 2: JP 4096205 B
Patent Literature 3: JP 2006-096656 A
Patent Literature 4: JP H8-12378 A
Patent Literature 5: JP 2010-180449 A

SUMMARY OF THE INVENTION

As mentioned above, it still cannot be said that a heat ray shielding performance of the composite tungsten oxide film by the dry method is sufficient.

Here, the present invention is invented to solve such circumstances, and a purpose of the present invention is to provide a cesium tungsten oxide film having high heat ray shielding performance and a radio wave transmissivity, and a method for manufacturing a cesium tungsten oxide film capable of manufacturing such film by a dry method.

Concerning the above problems, the inventors have considered that a heat ray shielding performance is based on a crystal condition of a film, and as a result of keen analyses about a relation of a heat ray shielding performance and a crystal condition of a cesium tungsten oxide film by a dry method by crystallizing this film and such, the inventors have achieved the present invention.

In other words, one embodiment of the present invention is a cesium tungsten oxide film comprising cesium, tungsten and oxygen as main components, wherein, when an atomic ratio of cesium and tungsten is Cs/W, the Cs/W is 0.1 or more and 0.5 or less, and also, the cesium tungsten oxide film is having a hexagonal crystal structure, and when an intensity ratio between a diffraction intensity I (200) of hexagonal (200) face and a diffraction intensity I (002) of hexagonal (002) face by X-ray diffraction using CuKα ray is I (002)/I (200), the I (002)/I (200) may be 0.3 or more.

According to one embodiment of the present invention, high heat ray shielding performance is achieved, by having a hexagonal crystal structure, and also, by comprising cesium and tungsten, which are heat ray shielding materials with high infrared absorption feature, in appropriate proportion.

At this time, in one embodiment of the present invention, when an angular ratio between a diffraction angle 2θ (200) of hexagonal (200) face and a diffraction angle 2θ (002) of hexagonal (002) face measured by X-ray diffraction using CuKα ray is 2θ (002)/2θ (200), the 2θ (002)/2θ (200) may be 0.83 or more and 0.85 or less.

The composite tungsten oxide film having such property is preferable as it is having a hexagonal crystal structure.

In addition, in one embodiment of the present invention, a ratio of an infrared transmissivity of a wavelength of 1400 nm with respect to a visible light transmissivity of a wavelength of 550 nm may be 0.3 or less.

According to one embodiment of the present invention, it can be said that it is having high heat ray shielding performance as it transmits a visible light while shielding an infrared ray at a high ratio.

In addition, in one embodiment of the present invention, it may be a sputtered film with a film thickness of 30 nm or more and 1200 nm or less.

The cesium tungsten oxide film relating to one embodiment of the present invention is formed mainly by a sputtering method, so it is not necessary to use a surfactant or a solvent, or a dispersing agent or a medium resin, and it can be formed thin. In addition, it does not involve significant volume contraction, so a film without an exfoliation or a crack is formed.

The cesium tungsten oxide film relating to one embodiment of the present invention may be the film having a sheet resistance over $1.0*10^{10}$ ohm per square.

According to one embodiment of the present invention, it can be said that it is having a radio wave transmissivity as it does not reflect radio waves.

In addition, other embodiment of the present invention is a method for manufacturing a cesium tungsten oxide film comprising cesium, tungsten and oxygen as main components, comprising: a film deposition process for deposition of a film using a cesium tungsten oxide target; and a heat treatment process for heat-treating the film at a temperature of 400° C. or more and less than 1000° C., wherein either the film deposition process or the heat treatment process may be performed in an atmosphere containing oxygen.

According to other embodiment of the present invention, a hexagonal crystal structure is formed by heat-treating the film after the film deposition process. In addition, the cesium tungsten oxide film with high heat ray shielding performance is obtained by the dry method, by performing either the film deposition process or the heat treatment process in an atmosphere containing oxygen.

In addition, in other embodiment of the present invention, after deposition of the film by sputtering in a mixed gas of argon and oxygen in the film deposition process, the film may be heat-treated at a temperature of 400° C. to 900° C. in an inert or reducing atmosphere in the heat treatment process.

When the film deposition process is performed in an atmosphere containing oxygen, it is preferable to perform in the above conditions.

In addition, in other embodiment of the present invention, after deposition of the film by sputtering in an argon gas in the film deposition process, the film may be heat-treated at a temperature of 400° C. to 600° C. in an air in the heat treatment process.

When the heat treatment process is performed in an atmosphere containing oxygen, it is preferable to perform in the above conditions.

According to the present invention, the cesium tungsten oxide film having high heat ray shielding performance and a radio wave transmissivity is obtained, and also, such film is manufactured by the dry method.

BRIEF DESCRIPTION OF THE DRAWINGS

FIG. 1 is a flow chart illustrating an outline of a process in a method for manufacturing a cesium tungsten oxide film relating to one embodiment of the present invention.

DETAILED DESCRIPTION OF THE INVENTION

Hereinafter, explaining about a cesium tungsten oxide film and a method for manufacturing same in the following order, by referring to the drawings. In addition, the present invention should not be limited by the following examples, and it can be modified optionally within a scope not deviating from a gist of the present invention.

1. Cesium tungsten oxide film
2. Method for manufacturing cesium tungsten oxide film
2-1. Film deposition process
2-2. Heat treatment process <Cesium Tungsten Oxide Film>

At first, explaining about a cesium tungsten oxide film. A cesium tungsten oxide film (Cs—W—O based tungsten oxide film) relating to one embodiment of the present invention comprises cesium (Cs), tungsten (W) and oxygen (O) as main components, wherein, when an atomic ratio of cesium and tungsten is Cs/W, the Cs/W is 0.1 to 0.5 (In this description, hereinafter "to" means lower limit or more and upper limit or less), and also, the cesium tungsten oxide film is having a hexagonal crystal structure. As such, a film having high heat ray shielding performance is achieved by having a hexagonal crystal structure, and also, by comprising cesium and tungsten, which are heat ray shielding materials with high infrared absorption feature, in appropriate proportion.

When the cesium tungsten oxide film relating to one embodiment of the present invention is formed by sputtering film deposition, Cs/w of the film will be almost equal to Cs/W of a target composition. When forming a film with different Cs/W, it can be prepared by sputtering film deposition using a target having composition with different Cs/W. When Cs/W is outside a range of 0.1 to 0.5, a film does not comprise a hexagonal crystal structure and a heat ray shielding performance will be decreased. In addition, a target, in which Cs/W is outside a range of 0.1 to 0.5, is difficult to manufacture as a sinterability and workability is deteriorated. An oxygen concentration of a film is having a significant influence on a heat ray shielding performance as it affects an electron condition of a crystal structure via oxygen vacancy, so it is necessary to control to be an appropriate oxygen concentration, but it is difficult to measure an oxygen concentration of a film. Here, an angular ratio by an X-ray diffraction, which will be described later, is controlled, by using a feature that a crystal structure changes slightly when an oxygen vacancy changes.

A feature that a film is having a hexagonal crystal structure can be known by X-ray diffraction analysis. Cs—W—O based tungsten oxide is known for a crystal structure such as hexagonal crystal, cubical crystal, tetragonal crystal, or orthorhombic crystal, and for a non-crystalline structure, but the cesium tungsten oxide film relating to one embodiment of the present invention is having a hexagonal crystal structure. However, it may contain a crystal structure other than hexagonal crystal, such as cubical crystal, tetragonal crystal, or orthorhombic crystal, and a non-crystalline structure.

When an angular ratio between a diffraction angle 2θ(200) of hexagonal (200) face and a diffraction angle 2θ (002) of hexagonal (002) face measured by X-ray diffraction using CuKα ray is 2θ (002)/2θ (200), the 2θ (002)/2θ (200) is 0.83~0.85. In ICDD reference code 01-081-1244 of a crystal structure database, a standard X-ray diffraction peak intensity and a diffraction angle of cesium tungsten oxide of hexagonal crystal are described.

In the ICDD reference code 01-081-1244, it is described that a diffraction angle of (002) face is 23.360 degree, and a diffraction angle of (200) face is 27.801 degree, so a standard angular ratio 2θ (002)/2θ (200) is 0.840. When atoms become excess or deficient compared to a standard hexagonal crystal structure, it is considered that an angular ratio changes as a axis length or c axis length changes. In order to measure a length of a axis or c axis directly, significantly careful and strict measurement is required, but by using an angular ratio which is a relative comparison of diffraction angles, it is possible to know a change in crystal condition relatively easily. When an angular ratio becomes outside of a range of 0.83 to 0.85 including a standard value of 0.840, it is considered that significant excess or deficiency of atoms occurs, and heat ray shielding performance will be decreased.

A film, which satisfies a condition that, when an angular ratio between a diffraction angle 2θ (200) of hexagonal (200) face and a diffraction angle 2θ (002) of hexagonal (002) face by X-ray diffraction using CuKα ray is 2θ (002)/2θ (200), the 2θ (002)/2θ (200) is 0.83 to 0.85, is having high heat ray shielding performance. Here, high heat ray shielding performance can be represented by a ratio of an infrared transmissivity of a wavelength of 1400 nm with respect to a visible light transmissivity of a wavelength of 550 nm. For example, when a visible light transmissivity of a wavelength of 550 nm is 65% or more, and when an infrared transmissivity of a wavelength of 1400 nm is 20% or less, a ratio of an infrared transmissivity of a wavelength of 1400 nm with respect to a visible light transmissivity of a wavelength of 550 nm is 0.3 or less. The cesium tungsten oxide film relating to one embodiment of the present invention satisfies this condition.

When an intensity ratio between a diffraction intensity I (200) of hexagonal (200) face and a diffraction intensity I (002) of hexagonal (002) face by X-ray diffraction using CuKα ray is I (002)/I (200), the I (002)/I (200) is 0.3 or more.

In the ICDD reference code 01-081-1244, it is described that a relative intensity of (002) surface with respect to (200) surface is 26.2%, so a standard intensity ratio I (002)/I (200) is 0.26. On the other hand, an intensity ratio of the present invention which expresses high heat ray shielding performance is 0.3 or more. The cesium tungsten oxide film relating to one embodiment of the present invention is having an intensity ratio higher than this standard intensity ratio, so it is considered that it tends to be c-axis oriented as growth of a, b-axes of hexagonal crystal is suppressed. Detailed mechanism is unknown, but when an intensity ratio is outside this range, a sheet resistance will be decreased, and a radio wave transmissivity will be decreased. It is considered that a crystal structure different from such standard is caused by a formation of a heat non-equilibrium and non-crystalline film by a sputtering method or a vacuum vapor deposition method.

It is preferable that the cesium tungsten oxide film relating to one embodiment of the present invention is formed in a film thickness of 30 nm to 1200 nm. As described in later, the cesium tungsten oxide film relating to one embodiment of the present invention is a sputtered film obtained by a sputtering film deposition or the like, so it is not necessary to use a surfactant or a solvent, or a dispersing agent or a medium resin, for example like an applied and fired film of Patent Literature 3, in which a solution is applied and heat-treated, so it is formed thin and uniform. In addition, the cesium tungsten oxide film relating to one embodiment of the present invention does not involve significant volume contraction at the time of heat treatment, so a film without an exfoliation or a crack is formed. When a film thickness is less than 30 nm, a ratio of an infrared transmissivity with respect to a visible light transmissivity will be over 0.3, and it will be difficult to obtain sufficient heat ray shielding performance. When a film thickness is more than 1200 nm, sufficient heat ray shielding performance will be maintained, but a productivity will be decreased by an increase in used amount of target, an increase in time of sputtering film deposition, and else.

In the cesium tungsten oxide film relating to one embodiment of the present invention, a sheet resistance is over $1.0*10^{10}$ ohm per square, more preferably $1.0*10^{11}$ ohm per square or more. When a sheet resistance becomes lower than this value, free electrons of the film will shield a static electric field and reflect radio waves, so a radio wave transmissivity will be decreased. A sheet resistance can be measured, for example by a resistivity meter.

<2. Method for Manufacturing Cesium Tungsten Oxide Film>

Next, explaining about a method for manufacturing a cesium tungsten oxide film. FIG. 1 is a flow chart illustrating an outline of a process in a method for manufacturing a cesium tungsten oxide film relating to one embodiment of the present invention. One embodiment of the present invention is a method for manufacturing a cesium tungsten oxide film comprising cesium, tungsten and oxygen as main components, comprising: a film deposition process S1 for deposition of a film using the cesium tungsten oxide target; and a heat treatment process S2 for heat-treating the film at a temperature of 400° C. or more and less than 1000° C. Either the film deposition process S1 or the heat treatment process S2 is performed in an atmosphere containing oxygen.

In this way, a hexagonal crystal structure is formed by heat-treating the film after the film deposition process S1, and also, the cesium tungsten oxide film having high heat ray shielding performance is obtained with a dry method by performing either the film deposition process S1 or the heat treatment process S2 in an atmosphere containing oxygen. Hereinafter, explaining in detail about each process.

(2-1. Film Deposition Process)

At first, in a film deposition process, a film is deposited by using a cesium tungsten oxide target. A method for manufacturing the cesium tungsten oxide target used in the film deposition process is not limited particularly, but Cs/W of a target composition is preferably 0.1 to 0.5. As it will be reflected to Cs/W of a film to be obtained. For example, the cesium tungsten oxide target described in the Patent Literature 5 may be used. However, a crystal structure of the target is not limited particularly, as it will not have an influence on a crystal structure of the film directly. In addition, it is preferable that the target is having a relative density of 70% or more and a specific resistance of 1 ohm cm or less. Such target can be manufactured by hot-press sintering cesium tungsten oxide powder in a vacuum or an inert atmosphere. A sintered body manufactured as such is having an intensity capable of withstanding a brazing temperature at the time of bonding and a mechanical machining when manufacturing the target, and it is having a conductivity capable of direct current sputtering.

It is preferable that a method for deposition of a film is a vacuum vapor deposition film formation or a sputtering film deposition. Especially, a direct current sputtering film deposition method, which applies a direct current voltage or a pulse voltage to the target, is more preferable. As it is having high film deposition speed and it is excellent in productivity. A substrate is not limited particularly, but a glass is preferable. As it is transparent in a visible light range, and it does not deteriorate or deform in a next process, i.e. a heat treatment process S2. A thickness of a glass is preferably 0.1 mm to 10 mm, and it is not limited particularly as long as it is having a thickness normally used for a window glass for a building, a glass for an automobile, a display device, or the like. In addition, a transparent heat-resistant polymer film may be used instead of a glass.

An argon gas or a mixed gas of argon and oxygen is used as a sputtering gas. Whether to use the argon gas or the mixed gas relates to a next process, i.e. a heat treatment process S2. An oxygen concentration is preferably less than 20%, more preferably 5% to 10%, as a productivity will be decreased as a film deposition speed decreases when oxygen concentration of the mixed gas is high. When using the argon gas as the sputtering gas, it is preferable that a purity of the argon gas is 99% or more and an oxygen concentration is less than 1%. A film deposited by sputtering is normally non-crystalline, but a diffraction peak based on a crystal may be emerged when performing X-ray diffraction analysis. As a hexagonal crystal structure is formed in the following heat treatment process S2.

(2-2. Heat Treatment Process)

Next, in a heat treatment process S2, a hexagonal crystal structure is formed by heat-treating the film obtained in the film deposition process S1. At this time, it is heat-treated by selecting an atmosphere according to a gas at the time of sputtering film deposition, such that an oxygen concentration of the film will be in an appropriate range. At this time, either the film deposition process S1 or the heat treatment process S2 is performed in an atmosphere containing oxygen.

In the film deposition process S1, when the film is deposited by using the mixed gas of argon and oxygen as the sputtering gas, a heat treatment of the film in the heat treatment process S2 is performed at a temperature of 400° C. to 900° C. in an inert or reducing atmosphere. As the inert or reducing atmosphere, a nitrogen gas, an argon gas, a mixed gas of hydrogen and nitrogen, a mixed gas of hydrogen and argon may be used. When the film deposition process S1 is performed in an atmosphere containing oxygen, if it is heat-treated in an oxidizing atmosphere such as air or oxygen in the heat treatment process S2, oxidation of the film progresses excessively and oxygen vacancy will be decreased, and a crystal structure changes and an angular ratio of X-ray diffraction will be less than 0.83, and a heat ray shielding performance will be decreased. When a heat treatment temperature is less than 400° C., the film remains to be non-crystalline and not crystallized, or even if it is crystallized, a diffraction peak of hexagonal crystal in X-ray diffraction will be extremely weak, and a heat ray shielding performance will be low. In addition, a hexagonal crystal structure maintains its structure even at a high temperature of 900° C. or more in an inert or reducing atmosphere, when a heat treatment temperature is higher than 1000° C., a modification of the film by a reaction of the film and the glass substrate, or a disappearance of the film by exfoliation occurs. In addition, in such high temperature, deformation of the glass substrate also occurs. A formation of hexagonal crystal progresses rapidly, so a heat treatment time is sufficient with 5 to 60 minutes.

On the other hand, in the film deposition process S1, it is considered that the film deposited by using only the argon gas as the sputtering gas is in a condition that an oxygen concentration of the film is moderate or insufficient. At this time, in the heat treatment process S2, it is heat-treated in an oxidizing atmosphere containing oxygen. When it is heat-treated in an inert gas such as nitrogen gas not containing oxygen, an intensity ratio of X-ray diffraction will be less than 0.3 and a sheet resistance will be decreased, and a radio wave transmissivity will not be obtained. When it is heat-treated in an oxidizing atmosphere containing oxygen, an oxygen concentration in the film will be maintained in more appropriate range, and a heat ray shielding performance will be more improved. Here, in the heat treatment process S2, it is preferable to select an air as a heat treatment atmosphere. Or, the heat treatment may be performed in an atmosphere with oxygen concentration of 5 to 20%. A heat treatment furnace for an air atmosphere may not have a specific sealing structure. The heat treatment temperature is 400° C. to 600° C. When the heat treatment temperature is less than 400° C., crystallization of the film will be insufficient and a heat ray shielding performance will be low. When the heat treatment temperature is more than 600° C., it will be oxidized excessively, so an angular ratio of X-ray diffraction will be less than 0.83 and a heat ray shielding performance will be decreased. The heat treatment time is sufficient with 5 to 60 minutes.

EXAMPLES

Hereinafter, explaining about the present invention concretely using examples, but the present invention is not limited to the examples in below.

Example 1

In example 1, cesium tungsten oxide powder (made by OHKUCHI ELECTRONICS CO., LTD., model number: YM-01), in which an atomic ratio of Cs/W is 0.33, was charged into a hot-pressing device, and sintered in a condition of a vacuum atmosphere, a temperature of 950° C., and a pressing pressure of 250 kgf/cm$^2$, and a cesium tungsten oxide sintered body was prepared. As a result of chemical analysis of a composition of the sintered body, Cs/W was 0.33. This oxide sintered body was grinded by mechanical machining to a diameter of 153 mm and a thickness of 5 mm, and it was bonded to a backing plate made of stainless steel by using a metal indium brazing material, and a cesium tungsten oxide target was prepared.

Next, this target was mounted to a sputtering device (made by ULVAC, Inc., model number: SBH2306), and a cesium tungsten oxide film with a film thickness of 400 nm was deposited on a glass substrate (EXG made by Corning Inc., thickness of 0.7 mm) in a condition that an ultimate vacuum was $5*10^{-3}$ Pa or less, a sputtering gas was a mixed gas of 5% oxygen/95% argon, a pressure of the sputtering gas was 0.6 Pa, an input power was 600 W in direct current (film deposition process S1). As a result of X-ray diffraction analysis of the film deposited at this time by using an X-ray diffraction device (X' Pert-PRO (made by PANalytical)), a diffraction peak cannot be confirmed and it was non-crystalline.

This film was charged into a lamp heating furnace (made by YONEKURA MFG Co., Ltd., model number: HP-2-9), and heat-treated for ten minutes at a temperature of 500° C. in a nitrogen atmosphere (heat treatment process S2). As a result of chemical analysis of this film, an atomic ratio of Cs/W was 0.31.

As a result of X-ray diffraction analysis of the heat-treated film by using the X-ray diffraction device (X' Pert-PRO (made by PANalytical)), a diffraction peak derived from a hexagonal crystal cesium tungsten oxide was observed. An angular ratio 2θ (002)/2θ (200) between a diffraction angle 2θ (200) of hexagonal (200) face and a diffraction angle 2θ (002) of hexagonal (002) face was 0.835. In addition, an intensity ratio I (002)/I (200) between a diffraction intensity I (200) of hexagonal (200) face and a diffraction intensity I (002) of hexagonal (002) face was 0.40. A transmissivity T' and a reflectivity R of the heat-treated film were measured by using a spectrophotometer (made by Hitachi, Ltd., model number: V-670). Interference fringes inherent to the film appear in the transmissivity T' and the reflectivity R, so a transmissivity T excluding an influence of the interference fringes was found by a Formula 1 below.

$$\text{Transmissivity } T=T'/(1-R) \quad \text{(Formula 1)}$$

In the obtained film, a visible light transmissivity of a wavelength of 550 nm was high as 80%, and an infrared transmissivity of a wavelength of 1400 nm was low as 6%. A ratio of an infrared transmissivity of a wavelength of 1400 nm with respect to a visible light transmissivity of a wavelength of 550 nm was low as 0.07. (In addition, the above ratio is a value calculated by measured values without rounding off transmissivities of each wavelength.)

In addition, as a result of measuring a sheet resistance of the obtained film by using a resistivity meter (made by Mitsubishi Chemical Corporation, Hiresta), a resistance was high as $2.5*10^{12}$ ohm per square. Thus, it was understood that it was having high heat ray shielding performance by absorbing an infrared region while maintaining sufficient transmissivity in a visible light region, and that it was having a radio wave transmissivity.

Example 2

In example 2, the target of the example 1 was used, and the sputtering film deposition and the heat treatment similar to the example 1 were performed except that a heat treatment time was 60 minutes. Cs/W of the obtained film was 0.30. As a result of X-ray diffraction of this film, the angular ratio was 0.840, and the intensity ratio was 0.42. In the obtained film, a visible light transmissivity of a wavelength of 550 nm was high as 88%, and an infrared transmissivity of a wavelength of 1400 nm was low as 13%. A ratio of an infrared transmissivity of a wavelength of 1400 nm with respect to a visible light transmissivity of a wavelength of 550 nm was low as 0.14. In addition, the sheet resistance of the obtained film was $2.8*10^{12}$ ohm per square. Thus, it was understood that it was having high heat ray shielding performance by absorbing an infrared region while maintaining sufficient transmissivity in a visible light region, and that it was having a radio wave transmissivity.

Example 3

In example 3, the target of the example 1 was used, and the sputtering film deposition and the heat treatment similar to the example 1 were performed except that a film thickness was 1200 nm, a heat treatment temperature was 400° C., and a heat treatment time was 60 minutes. Cs/W of the obtained film was 0.32. As a result of X-ray diffraction of this film, the angular ratio was 0.841, and the intensity ratio was 0.41. In the obtained film, a visible light transmissivity of a wavelength of 550 nm was high as 80%, and an infrared transmissivity of a wavelength of 1400 nm was low as 18%. A ratio of an infrared transmissivity of a wavelength of 1400 nm with respect to a visible light transmissivity of a wavelength of 550 nm was low as 0.22. In addition, the sheet resistance of the obtained film was $1.2*10^{11}$ ohm per square. Thus, it was understood that it was having high heat ray shielding performance by absorbing an infrared region while maintaining sufficient transmissivity in a visible light region, and that it was having a radio wave transmissivity.

Example 4

In example 4, the target of the example 1 was used, and the sputtering film deposition and the heat treatment similar to the example 1 were performed except that a sputtering gas was a mixed gas of 10% oxygen/90% argon. Cs/W of the obtained film was 0.32. As a result of X-ray diffraction of this film, the angular ratio was 0.840, and the intensity ratio was 0.43. In the obtained film, a visible light transmissivity of a wavelength of 550 nm was high as 72%, and an infrared transmissivity of a wavelength of 1400 nm was low as 3%. A ratio of an infrared transmissivity of a wavelength of 1400 nm with respect to a visible light transmissivity of a wavelength of 550 nm was low as 0.05. In addition, the sheet resistance of the obtained film was $1.1*10^{11}$ ohm per square. Thus, it was understood that it was having high heat ray shielding performance by absorbing an infrared region while maintaining sufficient transmissivity in a visible light region, and that it was having a radio wave transmissivity.

Example 5

In example 5, the target of the example 1 was used, and the sputtering film deposition and the heat treatment similar to the example 1 were performed except that a sputtering gas was a mixed gas of 10% oxygen/90% argon, and a heat treatment atmosphere was an atmosphere of 1% hydrogen/99% nitrogen. Cs/W of the obtained film was 0.31. As a result of X-ray diffraction of this film, the angular ratio was 0.841, and the intensity ratio was 0.39. In the obtained film, a visible light transmissivity of a wavelength of 550 nm was high as 80%, and an infrared transmissivity of a wavelength of 1400 nm was low as 10%. A ratio of an infrared transmissivity of a wavelength of 1400 nm with respect to a visible light transmissivity of a wavelength of 550 nm was low as 0.13. In addition, the sheet resistance of the obtained film was $1.1*10^{10}$ ohm per square. Thus, it was understood that it was having high heat ray shielding performance by absorbing an infrared region while maintaining sufficient transmissivity in a visible light region, and that it was having a radio wave transmissivity.

Example 6

In example 6, the target of the example 1 was used, and the sputtering film deposition and the heat treatment similar to the example 1 were performed except that a sputtering gas was a mixed gas of 10% oxygen/90% argon, a film thickness was 200 nm, a heat treatment atmosphere was an atmosphere of 5% hydrogen/95% nitrogen, and a heat treatment time was 60 minutes. Cs/W of the obtained film was 0.32. As a result of X-ray diffraction of this film, the angular ratio was 0.833, and the intensity ratio was 0.37. In the obtained film, a visible light transmissivity of a wavelength of 550 nm was high as 68%, and an infrared transmissivity of a wavelength of 1400 nm was low as 8%. A ratio of an infrared transmissivity of a wavelength of 1400 nm with respect to a visible light transmissivity of a wavelength of 550 nm was low as 0.11. In addition, the sheet resistance of the obtained film was $1.2*10^{10}$ ohm per square. Thus, it was understood that it was having high heat ray shielding performance by absorbing an infrared region while maintaining sufficient transmissivity in a visible light region, and that it was having a radio wave transmissivity.

Example 7

In example 7, the target of the example 1 was used, and the sputtering film deposition and the heat treatment similar to the example 1 were performed except that a sputtering gas was argon, a heat treatment atmosphere was an air, a heat treatment temperature was 400° C., and a heat treatment time was 60 minutes. Cs/W of the obtained film was 0.30. As a result of X-ray diffraction of this film, the angular ratio was 0.844, and the intensity ratio was 0.40. In the obtained film, a visible light transmissivity of a wavelength of 550 nm was high as 66%, and an infrared transmissivity of a wavelength of 1400 nm was low as 18%. A ratio of an infrared transmissivity of a wavelength of 1400 nm with respect to a visible light transmissivity of a wavelength of 550 nm was low as 0.27. In addition, the sheet resistance of the obtained film was $2.2*10^{12}$ ohm per square. Thus, it was understood that it was having high heat ray shielding performance by absorbing an infrared region while maintaining sufficient transmissivity in a visible light region, and that it was having a radio wave transmissivity.

Example 8

In example 8, the target of the example 1 was used, and the sputtering film deposition and the heat treatment similar to the example 1 were performed except that a sputtering gas was argon, and a heat treatment atmosphere was an air. Cs/W of the obtained film was 0.32. As a result of X-ray diffraction of this film, the angular ratio was 0.842, and the intensity ratio was 0.41. In the obtained film, a visible light transmissivity of a wavelength of 550 nm was high as 80%, and an infrared transmissivity of a wavelength of 1400 nm was low as 2%. A ratio of an infrared transmissivity of a wavelength of 1400 nm with respect to a visible light transmissivity of a wavelength of 550 nm was low as 0.02. In addition, the sheet resistance of the obtained film was $1.5*10^{13}$ ohm per square. Thus, it was understood that it was having high heat ray shielding performance by absorbing an infrared region while maintaining sufficient transmissivity in a visible light region, and that it was having a radio wave transmissivity.

Example 9

In example 9, the target of the example 1 was used, and the sputtering film deposition and the heat treatment similar to the example 1 were performed except that a sputtering gas was argon, a heat treatment atmosphere was an air, a heat treatment temperature was 600° C., and a heat treatment time was 5 minutes. Cs/W of the obtained film was 0.31. As a result of X-ray diffraction of this film, the angular ratio was 0.836, and the intensity ratio was 0.48. In the obtained film, a visible light transmissivity of a wavelength of 550 nm was high as 76%, and an infrared transmissivity of a wavelength of 1400 nm was low as 14%. A ratio of an infrared transmissivity of a wavelength of 1400 nm with respect to a visible light transmissivity of a wavelength of 550 nm was low as 0.18. In addition, the sheet resistance of the obtained film was $7.4*10^{13}$ ohm per square. Thus, it was understood that it was having high heat ray shielding performance by absorbing an infrared region while maintaining sufficient transmissivity in a visible light region, and that it was having a radio wave transmissivity.

Example 10

In example 10, the target of the example 1 was used, and the sputtering film deposition and the heat treatment similar to the example 1 were performed except that a film thickness was 30 nm. Cs/W of the obtained film was 0.33. As a result of X-ray diffraction of this film, the angular ratio was 0.837, and the intensity ratio was 0.36. In the obtained film, a visible light transmissivity of a wavelength of 550 nm was high as 85%, and an infrared transmissivity of a wavelength of 1400 nm was low as 20%. A ratio of an infrared transmissivity of a wavelength of 1400 nm with respect to a visible light transmissivity of a wavelength of 550 nm was low as 0.24. In addition, the sheet resistance of the obtained film was $1.3*10^{12}$ ohm per square. Thus, it was understood that it was having high heat ray shielding performance by absorbing an infrared region while maintaining sufficient transmissivity in a visible light region, and that it was having a radio wave transmissivity.

Example 11

In example 11, the target of the example 1 was used, and the sputtering film deposition and the heat treatment similar to the example 1 were performed except that a glass substrate was a synthetic quartz glass, a heat treatment temperature was 900° C., and a heat treatment time was 30 minutes. Cs/W of the obtained film was 0.35. As a result of X-ray diffraction of this film, the angular ratio was 0.845, and the intensity ratio was 0.66. In the obtained film, a visible light transmissivity of a wavelength of 550 nm was high as 60%, and an infrared transmissivity of a wavelength of 1400 nm was low as 7%. A ratio of an infrared transmissivity of a wavelength of 1400 nm with respect to a visible light transmissivity of a wavelength of 550 nm was low as 0.12. In addition, the sheet resistance of the obtained film was $1.1*10^{10}$ ohm per square. Thus, it was understood that it was having high heat ray shielding performance by absorbing an infrared region while maintaining sufficient transmissivity in a visible light region, and that it was having a radio wave transmissivity.

Example 12

The target was prepared similar to the example 1 except that cesium tungsten oxide powder (made by OHKUCHI ELECTRONICS CO., LTD., model number: YM-01), in which an atomic ratio of Cs/W is 0.33, and tungsten trioxide powder (made by Kojundo Chemical Lab. Co., Ltd.) were charged into the hot-pressing device, such that a weight ratio of the cesium tungsten oxide powder and the tungsten trioxide powder was 2:1 respectively. As a result of chemical analysis of the target composition, Cs/W was 0.15. Next, the sputtering film deposition and the heat treatment similar to the example 1 were performed except that a sputtering gas was a mixed gas of 10% oxygen/90% argon. Cs/W of the obtained film was 0.14. As a result of X-ray diffraction of this film, the angular ratio was 0.843, and the intensity ratio was 0.49. In the obtained film, a visible light transmissivity of a wavelength of 550 nm was high as 89%, and an infrared transmissivity of a wavelength of 1400 nm was low as 19%. A ratio of an infrared transmissivity of a wavelength of 1400 nm with respect to a visible light transmissivity of a wavelength of 550 nm was low as 0.21. In addition, the sheet resistance of the obtained film was $1.7*10^{11}$ ohm per square. Thus, it was understood that it was having high heat ray shielding performance by absorbing an infrared region while maintaining sufficient transmissivity in a visible light region, and that it was having a radio wave transmissivity.

Comparative Example 1

In comparative example 1, the target of the example 1 was used, and the sputtering film deposition similar to the example 1 was performed, but the heat treatment was not performed. Cs/W of the obtained film was 0.31. As a result of X-ray diffraction analysis of this film, a diffraction peak was not confirmed and it was non-crystalline, so the angular ratio and the intensity ratio were not obtained. In the obtained film, a visible light transmissivity of a wavelength of 550 nm was high as 99%, but an infrared transmissivity of a wavelength of 1400 nm was also high as 99%, so it was not shielding infrared rays. A ratio of an infrared transmissivity of a wavelength of 1400 nm with respect to a visible light transmissivity of a wavelength of 550 nm was high as 1.00. In addition, the obtained film was not shielding infrared rays, so a sheet resistance was not measured. Thus, it was understood that a heat ray shielding performance was low.

Comparative Example 2

In comparative example 2, the target of the example 1 was used, and the sputtering film deposition and the heat treatment similar to the example 1 were performed except that a heat treatment temperature was 300° C., and a heat treatment time was 60 minutes. As a result of X-ray diffraction analysis of this film, a diffraction peak of hexagonal crystal was extremely weak, so the angular ratio and the intensity ratio were not found. In the obtained film, a visible light transmissivity of a wavelength of 550 nm was high as 99%, but an infrared transmissivity of a wavelength of 1400 nm was also high as 99%, so it was not shielding infrared rays. A ratio of an infrared transmissivity of a wavelength of 1400 nm with respect to a visible light transmissivity of a wavelength of 550 nm was high as 1.00. In addition, the obtained film was not shielding infrared rays, so a sheet resistance was not measured. Thus, it was understood that a heat ray shielding performance was low.

Comparative Example 3

In comparative example 3, the target of the example 1 was used, and the sputtering film deposition and the heat treatment similar to the example 1 were performed except that a glass substrate was a synthetic quartz glass, a heat treatment temperature was 1000° C., and a heat treatment time was 60 minutes. As a result, the film was disappeared by exfoliating from the glass substrate.

Comparative Example 4

In comparative example 4, the target of the example 1 was used, and the sputtering film deposition and the heat treatment similar to the example 1 were performed except that a heat treatment atmosphere was oxygen and a heat treatment temperature was 600° C. Cs/W of the obtained film was 0.30. As a result of X-ray diffraction of this film, the intensity ratio was high as 0.40, but the angular ratio was low as 0.825. In the obtained film, a visible light transmissivity of a wavelength of 550 nm was high as 99%, but an infrared transmissivity of a wavelength of 1400 nm was also high as 99%, so it was not shielding infrared rays. A ratio of an infrared transmissivity of a wavelength of 1400 nm with respect to a visible light transmissivity of a wavelength of 550 nm was high as 1.00. In addition, the obtained film was not shielding infrared rays, so a sheet resistance was not measured. Thus, it was understood that a heat ray shielding performance was low.

Comparative Example 5

In comparative example 5, the target of the example 1 was used, and the sputtering film deposition and the heat treatment similar to the example 1 were performed except that a sputtering gas was argon, a heat treatment atmosphere was an air, a heat treatment temperature was 300° C., and a heat treatment time was 60 minutes. Cs/W of the obtained film was 0.32. As a result of X-ray diffraction analysis of this film, a diffraction peak of hexagonal crystal was extremely weak, so an angular ratio and an intensity ratio were not found. In the obtained film, a visible light transmissivity of a wavelength of 550 nm was low as 37%, and an infrared transmissivity of a wavelength of 1400 nm was high as 91%. A ratio of an infrared transmissivity of a wavelength of 1400 nm with respect to a visible light transmissivity of a wavelength of 550 nm was high as 2.50. In addition, the obtained film was not shielding infrared rays, so a sheet resistance was not measured. Thus, it was understood that a heat ray shielding performance was low.

Comparative Example 6

In comparative example 6, the target of the example 1 was used, and the sputtering film deposition and the heat treatment similar to the example 1 were performed except that a sputtering gas was argon, a heat treatment atmosphere was an air, and a heat treatment temperature was 650° C. Cs/W of the obtained film was 0.30. As a result of X-ray diffraction of this film, the intensity ratio was high as 0.32, but the angular ratio was low as 0.821. In the obtained film, a visible light transmissivity of a wavelength of 550 nm was high as 96%, but an infrared transmissivity of a wavelength of 1400 nm was also high as 99%, so it was not shielding infrared rays. A ratio of an infrared transmissivity of a wavelength of 1400 nm with respect to a visible light transmissivity of a wavelength of 550 nm was high as 1.03. In addition, the obtained film was not shielding infrared rays, so a sheet resistance was not measured. Thus, it was understood that a heat ray shielding performance was low.

Comparative Example 7

The target was prepared similar to the example 1 except that cesium tungsten oxide powder (made by OHKUCHI ELECTRONICS CO., LTD., model number: YM-01), in which an atomic ratio of Cs/W is 0.33, and tungsten trioxide powder (made by Kojundo Chemical Lab. Co., Ltd.) were charged into the hot-pressing device, such that a weight ratio of the cesium tungsten oxide powder and the tungsten trioxide powder was 1:2 respectively. As a result of chemical analysis of the target composition, Cs/W was 0.07. Next, the sputtering film deposition and the heat treatment similar to the example 1 were performed. Cs/W of the obtained film was 0.06. As a result of X-ray diffraction of this film, the intensity ratio was 0.36, but the angular ratio was high as 0.855. In the obtained film, a visible light transmissivity of a wavelength of 550 nm was high as 99%, but an infrared transmissivity of a wavelength of 1400 nm was also high as 80%, so it was not shielding infrared rays. A ratio of an infrared transmissivity of a wavelength of 1400 nm with respect to a visible light transmissivity of a wavelength of 550 nm was high as 0.81. In addition, the obtained film was not shielding infrared rays, so a sheet resistance was not measured. Thus, it was understood that a heat ray shielding performance was low.

Comparative Example 8

In comparative example 8, a film with a thickness of 15 nm was deposited by sputtering Ag to the film of the example 1. A sheet resistance at this time was 5 ohm per square, and it was understood that it was not having a radio wave transmissivity.

Conditions and results of the examples 1 to 12 and the comparative examples 1 to 8 are summarized in Table 1. As it can be understood from Table 1, in the examples 1 to 12, it was understood that it will be the cesium tungsten oxide film having high heat ray shielding performance, in which a visible light transmissivity of a wavelength of 550 nm was 65% or more, and also, an infrared transmissivity of a wavelength of 1400 nm was 20% or less, and a ratio of an infrared transmissivity of a wavelength of 1400 nm with respect to a visible light transmissivity of a wavelength of 550 nm was 0.3 or less, by applying a heat treatment in an appropriate condition to the film deposition by sputtering. Further, a sheet resistance was over $1.0*10^{10}$ ohm per square, so it was understood that it was having a radio wave transmissivity. On the other hand, in the comparative example 1 in which the heat treatment was not performed, and in the comparative examples 2 to 7 which do not satisfy the conditions of the cesium tungsten oxide film relating to one embodiment of the present invention and the method for manufacturing same, an infrared transmissivity of a wavelength of 1400 nm was 80% or more, and a heat ray shielding performance was low. In addition, in a light-shielding member in which a film was deposited by sputtering silver (Ag) as in the comparative example 8, it was not having a radio wave transmissivity.

TABLE 1

|  | Sputtering film deposition | | | | Heat treatment | | | |
|---|---|---|---|---|---|---|---|---|
|  | Cs/W of target | Sputtering gas | Film thickness (nm) | X-ray diffraction analysis | Atmosphere | Temperature (° C.) | Time (minute) | Cs/W of film |
| Example 1 | 0.33 | 5% oxygen/ 95% argon | 400 | Non-crystalline | Nitrogen | 500 | 10 | 0.31 |
| Example 2 | 0.33 | 5% oxygen/ 95% argon | 400 | Non-crystalline | Nitrogen | 500 | 60 | 0.30 |
| Example 3 | 0.33 | 5% oxygen/ 95% argon | 1200 | Non-crystalline | Nitrogen | 400 | 60 | 0.32 |
| Example 4 | 0.33 | 10% oxygen/ 90% argon | 400 | Non-crystalline | Nitrogen | 500 | 10 | 0.32 |
| Example 5 | 0.33 | 10% oxygen/ 90% argon | 400 | Non-crystalline | 1% hydrogen/ 99% nitrogen | 500 | 10 | 0.31 |
| Example 6 | 0.33 | 10% oxygen/ 90% argon | 200 | Non-crystalline | 5% hydrogen/ 95% nitrogen | 500 | 60 | 0.32 |
| Example 7 | 0.33 | Argon | 400 | Non-crystalline | Air | 400 | 60 | 0.30 |
| Example 8 | 0.33 | Argon | 400 | Non-crystalline | Air | 500 | 10 | 0.32 |
| Example 9 | 0.33 | Argon | 400 | Non-crystalline | Air | 600 | 5 | 0.31 |
| Example 10 | 0.33 | 5% oxygen/ 95% argon | 30 | Non-crystalline | Nitrogen | 500 | 10 | 0.33 |
| Example 11 | 0.33 | 5% oxygen/ 95% argon | 400 | Non-crystalline | Nitrogen | 900 | 30 | 0.35 |
| Example 12 | 0.15 | 10% oxygen/ 90% argon | 400 | Non-crystalline | Nitrogen | 500 | 10 | 0.14 |
| Comparative example 1 | 0.33 | 5% oxygen/ 95% argon | 400 | Non-crystalline | None | — | — | 0.31 |
| Comparative example 2 | 0.33 | 5% oxygen/ 95% argon | 400 | Non-crystalline | Nitrogen | 300 | 60 | 0.32 |
| Comparative example 3 | 0.33 | 5% oxygen/ 95% argon | 400 | Non-crystalline | Nitrogen | 1000 | 60 | Film disappeared |
| Comparative example 4 | 0.33 | 5% oxygen/ 95% argon | 400 | Non-crystalline | Oxygen | 600 | 10 | 0.30 |
| Comparative example 5 | 0.33 | Argon | 400 | Non-crystalline | Air | 300 | 60 | 0.32 |
| Comparative example 6 | 0.33 | Argon | 400 | Non-crystalline | Air | 650 | 10 | 0.30 |

TABLE 1-continued

| | | | | | | | | |
|---|---|---|---|---|---|---|---|---|
| Comparative example 7 | 0.07 | 5% oxygen/ 95% argon | 400 | Non-crystalline | Nitrogen | 500 | 10 | 0.06 |
| Comparative example 8 | | | | Film with a thickness of 15 nm was formed by sputtering Ag on the film of the example 1. | | | | |

| | X-ray diffraction | | Spectrometry | | | |
|---|---|---|---|---|---|---|
| | Angular | Intensity | Transmissivity % | | Transmissivity | Sheet |
| | ratio $2\theta(002)/2\theta(200)$ | ratio $I(002)/I(200)$ | Wavelength 550 nm | Wavelength 1400 nm | ratio T1400/T550 | resistance ($\Omega/\square$) |
| Example 1 | 0.835 | 0.40 | 80 | 6 | 0.07 | $2.5 \times 10^{12}$ |
| Example 2 | 0.840 | 0.42 | 88 | 13 | 0.14 | $2.8 \times 10^{12}$ |
| Example 3 | 0.841 | 0.41 | 80 | 18 | 0.22 | $1.2 \times 10^{11}$ |
| Example 4 | 0.840 | 0.43 | 72 | 3 | 0.05 | $1.1 \times 10^{11}$ |
| Example 5 | 0.841 | 0.39 | 80 | 10 | 0.13 | $1.1 \times 10^{10}$ |
| Example 6 | 0.833 | 0.37 | 68 | 8 | 0.11 | $1.2 \times 10^{10}$ |
| Example 7 | 0.844 | 0.40 | 66 | 18 | 0.27 | $2.2 \times 10^{12}$ |
| Example 8 | 0.842 | 0.41 | 80 | 2 | 0.02 | $1.5 \times 10^{13}$ |
| Example 9 | 0.836 | 0.48 | 76 | 14 | 0.18 | $7.4 \times 10^{13}$ |
| Example 10 | 0.837 | 0.36 | 85 | 20 | 0.24 | $1.3 \times 10^{12}$ |
| Example 11 | 0.845 | 0.66 | 60 | 7 | 0.12 | $1.1 \times 10^{10}$ |
| Example 12 | 0.843 | 0.49 | 89 | 19 | 0.21 | $1.7 \times 10^{11}$ |
| Comparative example 1 | Noncrystalline | — | 99 | 99 | 1.00 | — |
| Comparative example 2 | Weak diffraction peak | — | 99 | 99 | 1.00 | — |
| Comparative example 3 | — | — | — | — | — | — |
| Comparative example 4 | 0.825 | 0.40 | 99 | 99 | 1.00 | — |
| Comparative example 5 | Weak diffraction peak | — | 37 | 91 | 2.50 | — |
| Comparative example 6 | 0.821 | 0.32 | 96 | 99 | 1.03 | — |
| Comparative example 7 | 0.855 | 0.36 | 99 | 80 | 0.81 | — |
| Comparative example 8 | — | — | — | — | — | 5 |

In addition, it was explained in detail about one embodiment and each example of the present invention as the above, but it is easy for those who skilled in the art to understand that various modifications are possible without substantially departing from new matters and effects of the present invention. Therefore, all of such modified examples are included within the scope of the present invention.

For example, a term used at least once in the description or drawings together with a different term that is broader or the same in meaning can also be replaced by the different term in any place in the description or drawings. Further, the configurations of the cesium tungsten oxide film and the method for manufacturing same are not limited to those described in one embodiment and each example of the present invention, but may be carried out in various modifications.

The cesium tungsten oxide film relating to the present invention is having excellent heat ray shielding performance and radio wave transmissivity, so it is industrially applicable to be used as a light-shielding member such as a window material.

The invention claimed is:

1. A cesium tungsten oxide film comprising cesium, tungsten and oxygen as main components,
wherein an atomic ratio of the cesium and the tungsten is Cs/W, the Cs/W is 0.33 or more and 0.5 or less, the cesium tungsten oxide film has a hexagonal crystal structure and a sheet resistance of over $1.0*10^{10}$ ohm per square, and the cesium tungsten oxide film does not contain a particle dispersion, and
an intensity ratio of a diffraction intensity I (200) of hexagonal (200) face and a diffraction intensity I (002) of hexagonal (002) face by X-ray diffraction using CuKα ray is I (002)/I (200), and the I (002)/I (200) is 0.3 or more.

2. The cesium tungsten oxide film according to claim 1, wherein an angular ratio of a diffraction angle 2θ (200) of hexagonal (200) face and a diffraction angle 2θ (002) of hexagonal (002) face by X-ray diffraction using CuKα ray is 2θ (002)/2θ (200), and the 2θ (002)/2θ (200) is 0.83 or more and 0.85 or less.

3. The cesium tungsten oxide film according to claim 1, wherein a ratio of an infrared transmissivity of a wavelength of 1400 nm with respect to a visible light transmissivity of a wavelength of 550 nm is 0.3 or less.

4. The cesium tungsten oxide film according to claim 1, wherein it is a sputtered film with a film thickness of 30 nm or more and 1200 nm or less.

5. The cesium tungsten oxide film according to claim 1, wherein the cesium tungsten oxide film has a sheet resistance of over $1.0*10^{11}$ ohm per square.

6. The cesium tungsten oxide film according to claim 1, wherein the cesium tungsten oxide film has a sheet resistance that is in a range of from $1.1*10^{10}$ ohm per square to $7.4*10^{13}$ ohm per square.

7. The cesium tungsten oxide film according to claim 1, wherein I (002)/I (200) is in a range of from 0.36 to 0.66.

8. A method for manufacturing a cesium tungsten oxide film according to claim 1, comprising:
- a film deposition process for deposition of a film using a cesium tungsten oxide target; and
- a heat treatment process for heat-treating the film at a temperature of 400° C. or more and less than 1000° C.,
- wherein either the film deposition process or the heat treatment process is performed in an atmosphere containing oxygen.

9. The method for manufacturing a cesium tungsten oxide film according to claim 8, wherein, after deposition of the film by sputtering in a mixed gas of argon and oxygen in the film deposition process, the film is heat-treated at a temperature of 400° C. to 900° C. in an inert or reducing atmosphere in the heat treatment process.

10. The method for manufacturing a cesium tungsten oxide film according to claim 8, wherein, after deposition of the film by sputtering in an argon gas in the film deposition process, the film is heat-treated at a temperature of 400° C. to 600° C. in an air in the heat treatment process.

\* \* \* \* \*